United States Patent
Min et al.

(10) Patent No.: US 8,395,569 B2
(45) Date of Patent: Mar. 12, 2013

(54) DUAL PANEL TYPE ORGANIC ELECTROLUMINESCENT DISPLAY DEVICE AND METHOD OF FABRICATING THE SAME

(75) Inventors: Kyung-Hee Min, Seoul (KR); Sung-Joon Bae, Guri-si (KR); Joon-Suk Lee, Seoul (KR); Do-Hyung Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 475 days.

(21) Appl. No.: 12/588,257

(22) Filed: Oct. 8, 2009

(65) Prior Publication Data

US 2010/0110048 A1    May 6, 2010

(30) Foreign Application Priority Data

Nov. 3, 2008   (KR) .................. 10-2008-0108571

(51) Int. Cl.
  *G09G 3/32*   (2006.01)
(52) U.S. Cl. ................ 345/82; 345/76; 345/83; 257/88; 257/91; 313/498; 313/505
(58) Field of Classification Search .................. 345/55, 345/76–83; 313/498–506; 257/40, 52–63, 257/72, 79–103
See application file for complete search history.

(56) References Cited

U.S. PATENT DOCUMENTS

| | | | |
|---|---|---|---|
| 6,005,344 A * | 12/1999 | Fleming | 313/498 |
| 6,414,432 B1 * | 7/2002 | Hieda et al. | 313/506 |
| 2002/0014836 A1 * | 2/2002 | Codama et al. | 313/504 |
| 2003/0094607 A1 * | 5/2003 | Guenther et al. | 257/40 |
| 2005/0140303 A1 * | 6/2005 | Lee et al. | 315/169.3 |
| 2006/0119259 A1 * | 6/2006 | Bae et al. | 313/506 |
| 2006/0119260 A1 * | 6/2006 | Kim | 313/506 |
| 2007/0001594 A1 * | 1/2007 | Yoo et al. | 313/506 |
| 2007/0132374 A1 * | 6/2007 | Park | 313/504 |

\* cited by examiner

*Primary Examiner* — Lun-Yi Lao
*Assistant Examiner* — Gregory J Tryder
(74) *Attorney, Agent, or Firm* — McKenna Long & Aldridge LLP

(57) ABSTRACT

The present invention relates to an organic electroluminescent display (OELD) device, more particularly, to a dual panel type OELD device and a method of fabricating the same. The OLED structure has first and second barrier walls having a reverse-taper shape with respect to the first substrate and first and second side surfaces, wherein the walls define novel polymer patterns with varying heights relative to each other.

17 Claims, 10 Drawing Sheets

DUAL PANEL TYPE ORGANIC ELECTROLUMINESCENT DISPLAY DEVICE AND METHOD OF FABRICATING THE SAME

The present application claims the benefit of Korean Patent Application No. 10-2008-0108571 filed in Korea on Nov. 3, 2008, which is hereby incorporated by reference for all purposes as if fully set forth herein.

BACKGROUND

1. Technical Field

The present invention relates to an organic electroluminescent display (OELD) device, more particularly, to a dual panel type OELD device and a method of fabricating the same.

2. Related Art

An OELD device of new flat panel display devices is a self-emitting type. The OELD device has excellent characteristics of viewing angle, contrast ratio, and so on. Also, since the OELD device does not require a backlight assembly, the OELD device has low weight and low power consumption. Moreover, the OELD device has advantages of high response rate, low production cost, and so on.

FIG. 1 is a circuit diagram showing a pixel region of the related art OELD device. As shown in FIG. 1, a gate line "GL", a data line "DL", a power supply line "PL", a switching thin film transistor (TFT) "STr", a storage capacitor "StgC", a driving TFT "DTr", and an organic electroluminescent diode "E" are formed in one pixel region "P". The gate line "GL" and the data line "DL" cross each other such that the pixel region "P" is defined, and the power supply line "PL" is formed to be parallel to the data line "DL". The switching TFT "STr" is formed at crossing portion of the gate and data line "GL" and "DL". The driving TFT "DTr" is electrically connected to the switching TFT "STr".

The driving TFT "DTr" is electrically connected to the organic electroluminescent diode "E". In more detail, a first electrode of the organic electroluminescent diode "E" is connected to a drain electrode of the driving TFT "DTr", and a second electrode of the organic electroluminescent diode "E" is connected to the power supply line "PL". The power supply line "PL" provides a source voltage to the organic electroluminescent diode "E". The storage capacitor "Cst" is disposed between gate and source electrodes of the driving TFT "DTr".

When a signal is applied to the switching TFT "STr" through the gate line "GL" such that the switching TFT "STr" is turned on, a signal from the data line "DL" is applied to the gate electrode of the driving TFT "DTr" such that the driving TFT "DTr" is turned on. As a result, light is emitted from the organic electroluminescent diode "E". In this case, when the driving TFT "DTr" is turned on, a level of an electric current applied from the power supply line "PL" to the organic electroluminescent diode "E" is determined such that the organic electroluminescent diode "E" can produce a gray scale. The storage capacitor "StgC" serves as maintaining the voltage of the gate electrode of the driving TFT "DTr" when the switching TFT "STr" is turned off. Accordingly, even if the switching TFT "STr" is turned off, a level of an electric current applied from the power supply line "PL" to the organic electroluminescent diode "E" is maintained to next frame.

Array elements, for example, the TFTs, and the organic electroluminescent diode including an anode, a cathode and an organic emitting layer are formed on a single substrate. Alternatively, the array elements and the organic electroluminescent diode are formed on different substrates and a connection electrode for connecting the array elements and the organic electroluminescent diode is further formed. The latter may be called as a dual panel type OELD device.

FIG. 2 is a cross-sectional view showing one pixel region of the related art dual panel type OELD device. In FIG. 2, a gate line (not shown) and a data line 15 are formed on a first substrate 10. The gate line and the data line 15 cross each other to define a pixel region. A switching TFT (not shown) and a driving TFT "DTr" are formed in the pixel region. A passivation layer 25 covering the switching TFT and the driving TFT "DTr" is formed. The passivation layer 25 includes a contact hole 27 exposing a drain electrode 20 of the driving TFT "DTr". A connection electrode 35 connected to the drain electrode 20 of the driving TFT "DTr" through the contact hole 27 is formed on the passivation layer 25.

In addition, a first electrode 53 is formed on a second substrate 50. A buffer pattern 57 corresponding to boundaries of the pixel region is formed on the first electrode 53, and a column spacer 55 is formed on a portion of the pixel region. A wall 60 having a reverse-taper shape with respect to an inner surface of the second substrate 50 is formed on the buffer pattern 57. Moreover, an organic emitting layer 65 and a second electrode 70 are formed on the first electrode 53. The organic emitting layer 65 and the second electrode 70 are respectively isolated from those in adjacent pixel region. The first electrode 53, the organic emitting layer 65 and the second electrode 70 constitute an organic electroluminescent diode "E". The second electrode 70 contacts the connection electrode 35 on the first substrate 10 such that the organic electroluminescent diode "E" is electrically connected to the driving TFT "DTr".

A seal pattern (not shown) is formed on edges of one of the first and second substrates 10 and 50 for sealing an inner space between the first and second substrates 10 and 50. The inner space of the first and second substrates 10 and 50 is filled with an inert gas or has a vacuum condition to preventing from being damaged by moisture or air.

In a fabricating process of the dual panel type OELD device 1, particularly, the second electrode 70 in one pixel region should be isolated from that in adjacent pixel region. To obtain this structure, the wall 60 having a reverse-taper shape is formed of an organic insulating material on the second substrate 50. One end, which is closer to the second substrate 50 than the other end, of the wall 60 has a first cross-sectional area smaller than a second cross-sectional area of the other end. The wall 60 surrounds each pixel region. An organic emitting material and a metallic material are sequentially coated and deposited on the second substrate 50, where the wall 60 has been formed, to form the organic emitting layer 65 and the second electrode 70.

However, the wall 60 and the column spacer 55 for the dual panel type OELD device are formed by different process such that one more mask process is required. In addition, since there is a continuous metal pattern 73 on the wall 60, there is a brightness problem due to particles. Moreover, since the driving TFT "DTr" on the first substrate 10 and the organic electroluminescent diode "E" have a point contact with the column spacer 55, a possibility of a contact problem is increased.

To overcome these problems, a spacer-free type OELD device including a dual-structured wall, which serves as a connection electrode, without the column spacer is introduced. Unfortunately, there is still a problem. Since the second electrode of the organic electroluminescent diode continuously formed on the dual-structured wall is used as a connection electrode, a planarization layer is required over the second substrate to obtain an uniform height of the dual-structure wall. When the planarization layer formed of an organic insulating material is heated, a gas is generated from the planarization layer. When the organic emitting material of the organic emitting layer is exposed to the gas, a thermal degradation is generated in the organic emitting layer such that a lifetime of the OELD device is reduced. In addition, a control of a contact area between elements on the first and second substrates of the spacer-free type OELD device is impossible.

SUMMARY

Accordingly, the present invention is directed to a dual panel type organic electroluminescent display device and a method of fabricating the same that substantially obviate one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In accordance with the present invention, as embodied and broadly described herein, a dual panel type organic electroluminescent display device includes first and second substrates facing each other and having a pixel region and a border region at a boundary of the pixel region; a first electrode in the pixel region and the border region and on the first substrate; first and second walls in the border region and on the first electrode, the first and second walls spaced apart from each other, each of the first and second walls having a reverse-taper shape with respect to the first substrate and first and second side surfaces, wherein the second side surface of the first wall faces the second side surface of the second wall, and the first side surfaces of the first and second walls are respectively opposite to the second side surfaces of the first and second walls; a first pattern covering the first side surfaces of the first and second walls and having a first height from the first electrode; a second pattern covering an upper surface of at least one of the first and second walls and having a second height from the first electrode greater than the first height; an organic emitting layer on the first electrode; a second electrode on the organic emitting layer, a portion of the second electrode covering an upper surface of the organic emitting layer on the second pattern; a switching thin film transistor in the pixel region and on the second substrate; a driving thin film transistor in the pixel region and on the second substrate, the driving thin film transistor connected to the switching thin film transistor; and a connection electrode on the second substrate and connected to the driving TFT and the portion of the second electrode.

In another aspect of the present invention, a dual panel type organic electroluminescent display device includes first and second substrates facing each other and having a pixel region and a border region at a boundary of the pixel region; a first electrode in the pixel region and the border region and on the first substrate; first and second walls in the border region and on the first electrode, the first and second walls spaced apart from each other, each of the first and second walls having a reverse-taper shape with respect to the first substrate and first and second side surfaces, wherein the second side surface of the first wall faces the second side surface of the second wall, and the first side surfaces of the first and second walls are respectively opposite to the second side surfaces of the first and second walls; a protruding portion extending from the first wall into the pixel region; a first pattern covering the first side surfaces of the first and second walls and having a first height from the first electrode; a second pattern covering an upper surface of the protruding portion and having a second height from the first electrode greater than the first height; an organic emitting layer on the first electrode and the protruding portion; a second electrode on the organic emitting layer, a portion of the second electrode covering an upper surface of the organic emitting layer on the protruding portion; a switching thin film transistor in the pixel region and on the second substrate; a driving thin film transistor in the pixel region and on the second substrate, the driving thin film transistor connected to the switching thin film transistor; and a connection electrode on the second substrate and connected to the driving TFT and the portion of the second electrode.

In yet another aspect of the present invention, a method of fabricating a dual panel type organic electroluminescent display device includes forming a first electrode on an entire surface of a first substrate having a pixel region and a border region at a boundary of the pixel region; forming first and second walls of an insulating material in the border region and on the first electrode, the first and second walls spaced apart from each other, each of the first and second walls having a reverse-taper shape with respect to the first substrate and first and second side surfaces, wherein the second side surface of the first wall faces the second side surface of the second wall, and the first side surfaces of the first and second walls are respectively opposite to the second side surfaces of the first and second walls; forming a polymer material layer on the first and second walls and having a flat top surface; forming first and second photoresist patterns on the polymer material layer and corresponding to the first and second walls, a thickness of the first photoresist pattern being smaller than a thickness of the second photoresist pattern; removing one portion of the polymer material layer exposed through the first and second photoresist patterns to form a polymer pattern covering the first side surfaces of the first and second patterns and an upper surface of each of the first and second walls; exposing a portion of the upper surface of each of the first and second walls by completely removing the first photoresist pattern and forming a third photoresist patterning by partially removing the second photoresist pattern; removing another portion of the polymer pattern exposed through the third pattern to form a first pattern covering the first side surfaces of the first and second walls and having a first height from the first electrode and a second patterning covering an upper surface of at least one of the first and second walls and having a second height from the first electrode greater than the first height; forming an organic emitting layer on the first electrode, the first and second patterns; and forming a second electrode on the organic emitting layer, a portion of the second electrode covering an upper surface of the organic emitting layer on the second pattern.

In yet another aspect of the present invention, a method of fabricating a dual panel type organic electroluminescent display device includes forming a first electrode on an entire surface of a first substrate having a pixel region and a border region at a boundary of the pixel region; forming first and second walls of an insulating material in the border region and on the first electrode and a protruding portion of the insulating material extending from the first wall into the pixel region, the first and second walls spaced apart from each other, each of the first and second walls having a reverse-taper shape with respect to the first substrate and first and second side surfaces, wherein the second side surface of the first wall faces the second side surface of the second wall, and the first side surfaces of the first and second walls are respectively opposite to the second side surfaces of the first and second walls;

forming a first pattern covering the first side surfaces of the first and second walls and having a first height from the first electrode and a second pattern covering an upper surface of the protruding portion and having a second height from the first electrode greater than the first height; forming an organic emitting layer on the first electrode and the protruding portion; forming a second electrode on the organic emitting layer, a portion of the second electrode covering an upper surface of the organic emitting layer on the protruding portion; forming a switching thin film transistor in the pixel region and on the second substrate; forming a driving thin film transistor in the pixel region and on the second substrate, the driving thin film transistor connected to the switching thin film transistor; forming a connection electrode on the second substrate and connected to the driving TFT; and attaching the first and second substrates so that the connection electrode contacts a portion of the second electrode corresponding to the second pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the preferred embodiments, examples of which are illustrated in the accompanying drawings.

Figure 1:
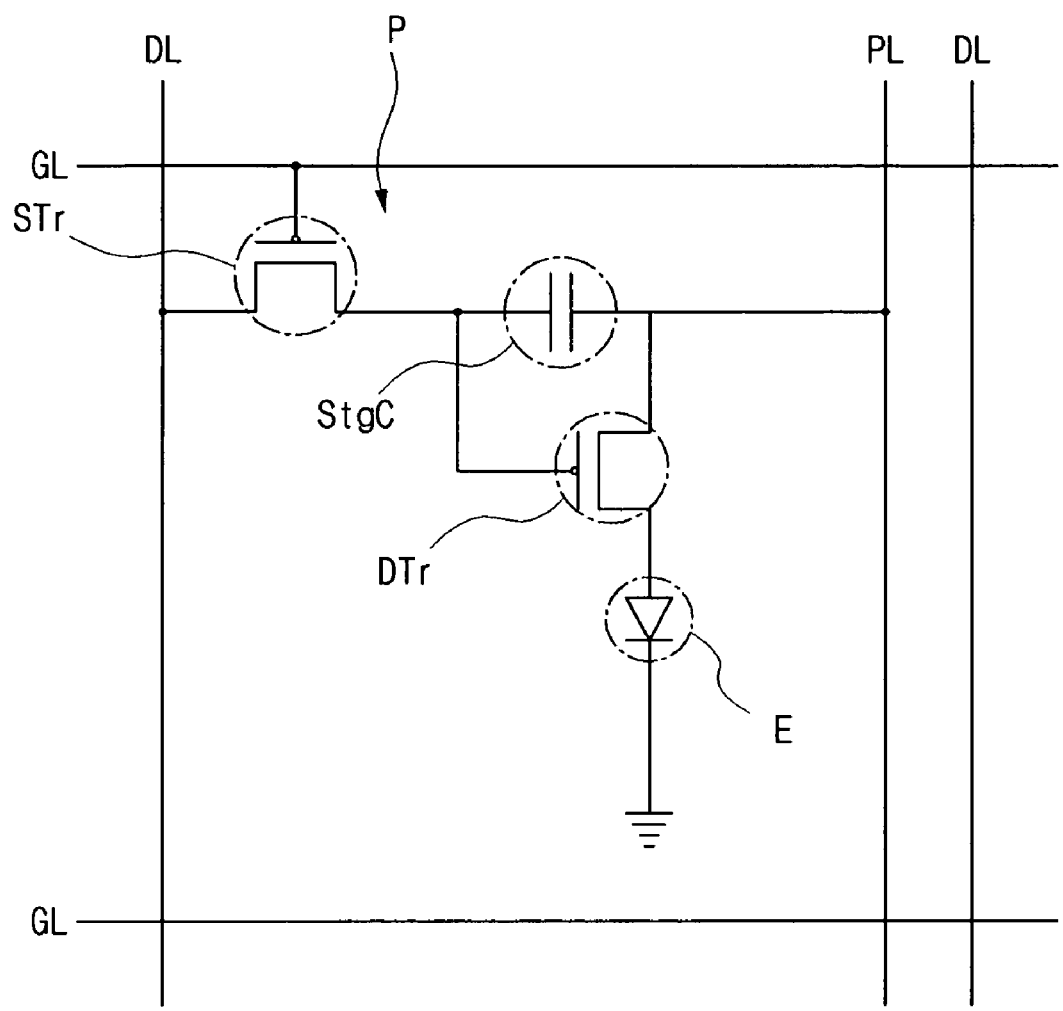
FIG. 1 is a circuit diagram showing a pixel region of the related art OELD device.
Figure 2:
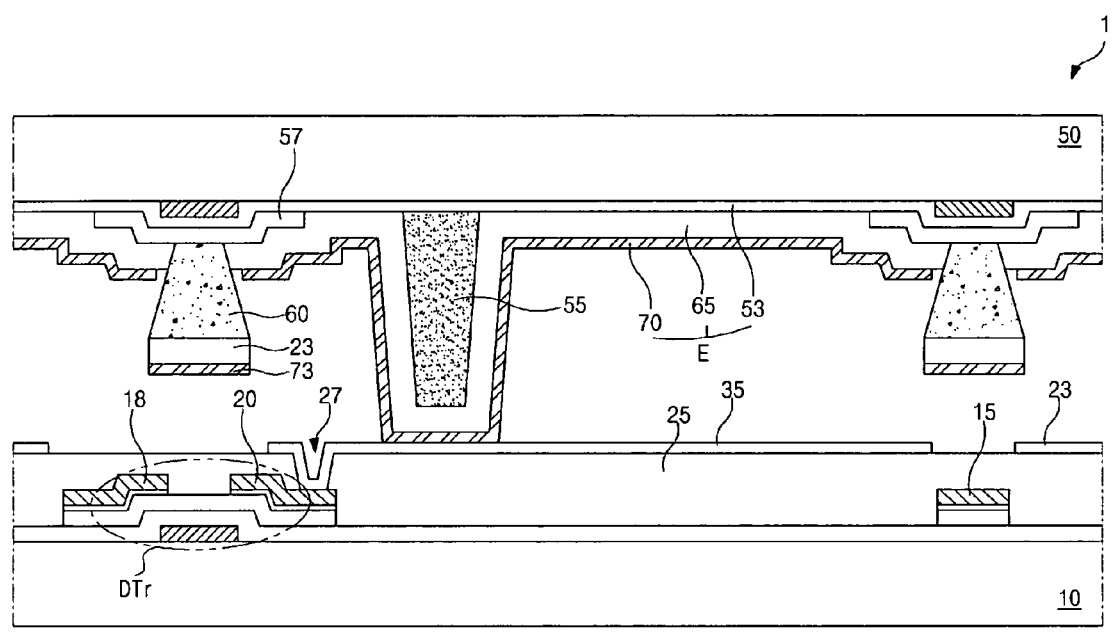
FIG. 2 is a cross-sectional view showing one pixel region of the related art dual panel type OELD device.
Figure 3A:
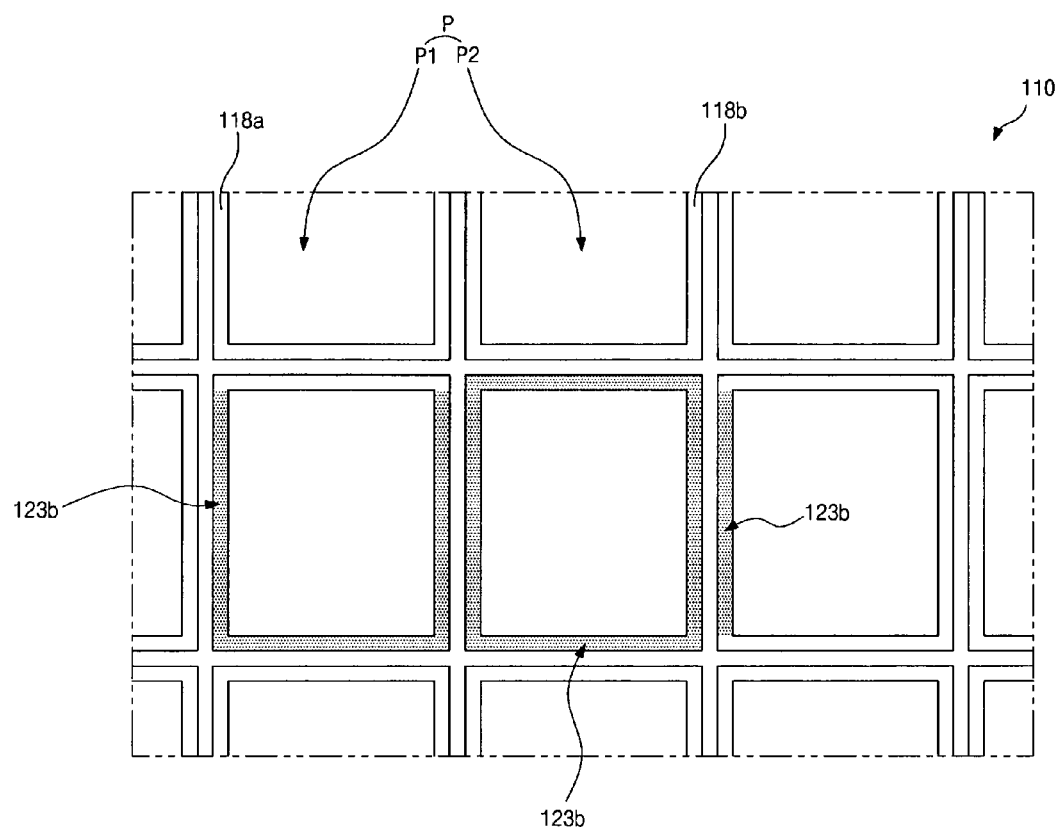
FIGS. 3A to 3E are plan view of a portion of a dual panel type OELD device according to present invention, respectively.
Figure 3B:
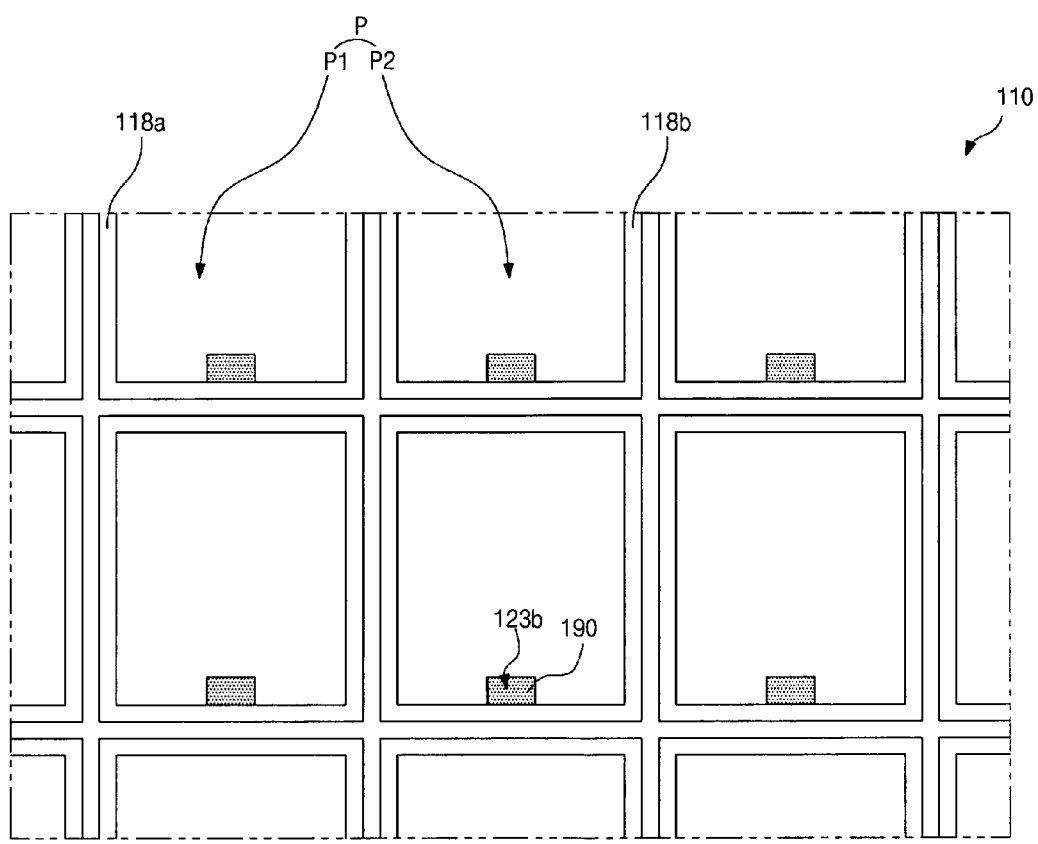
Figure 3C:
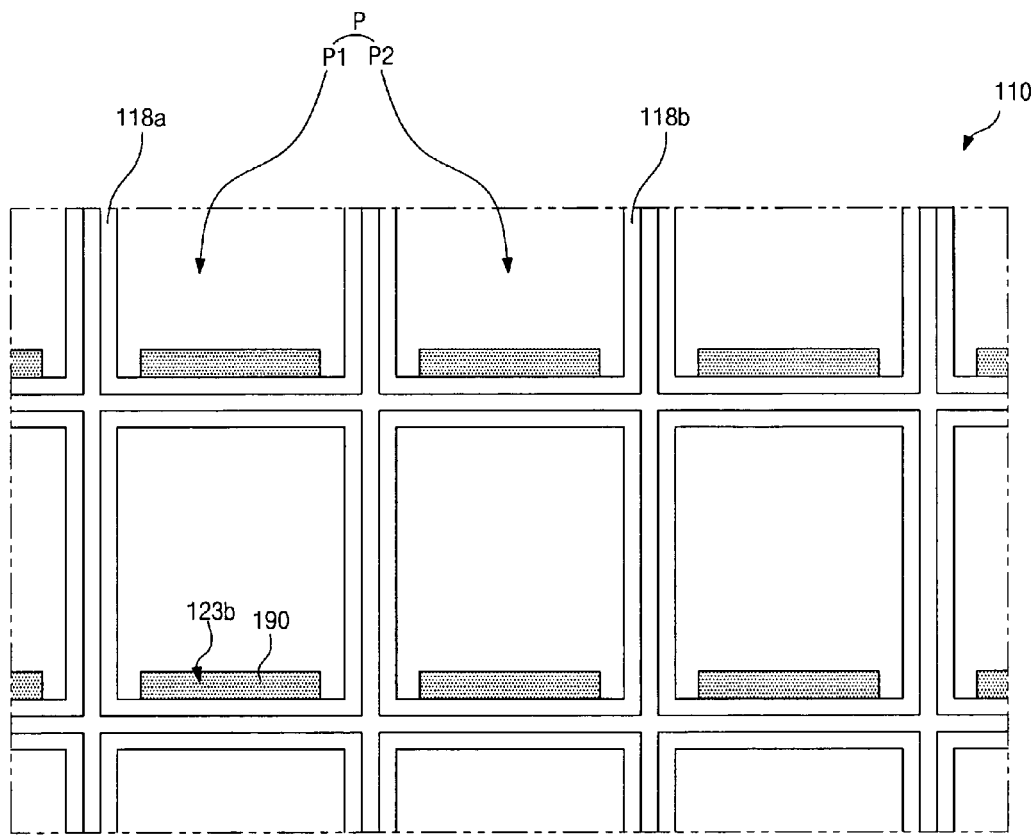
Figure 3D:
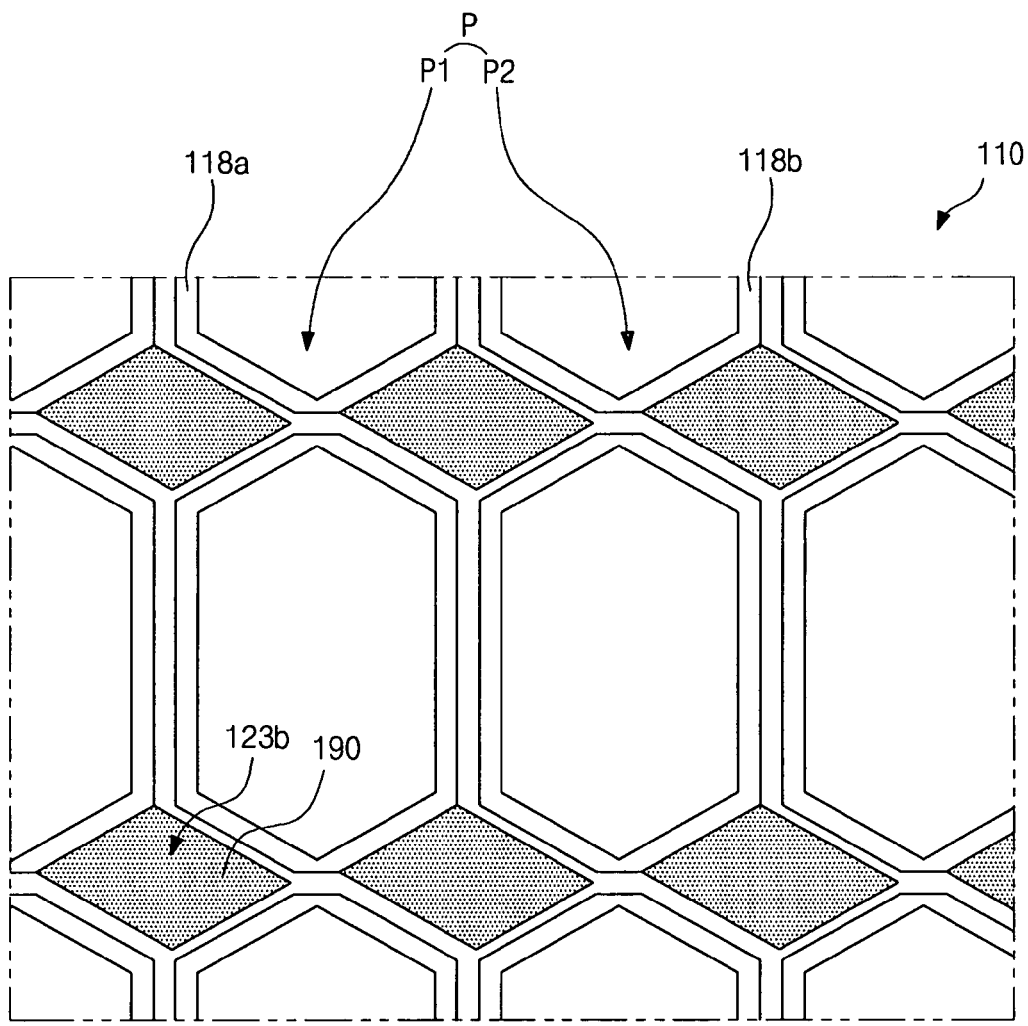
Figure 3E:
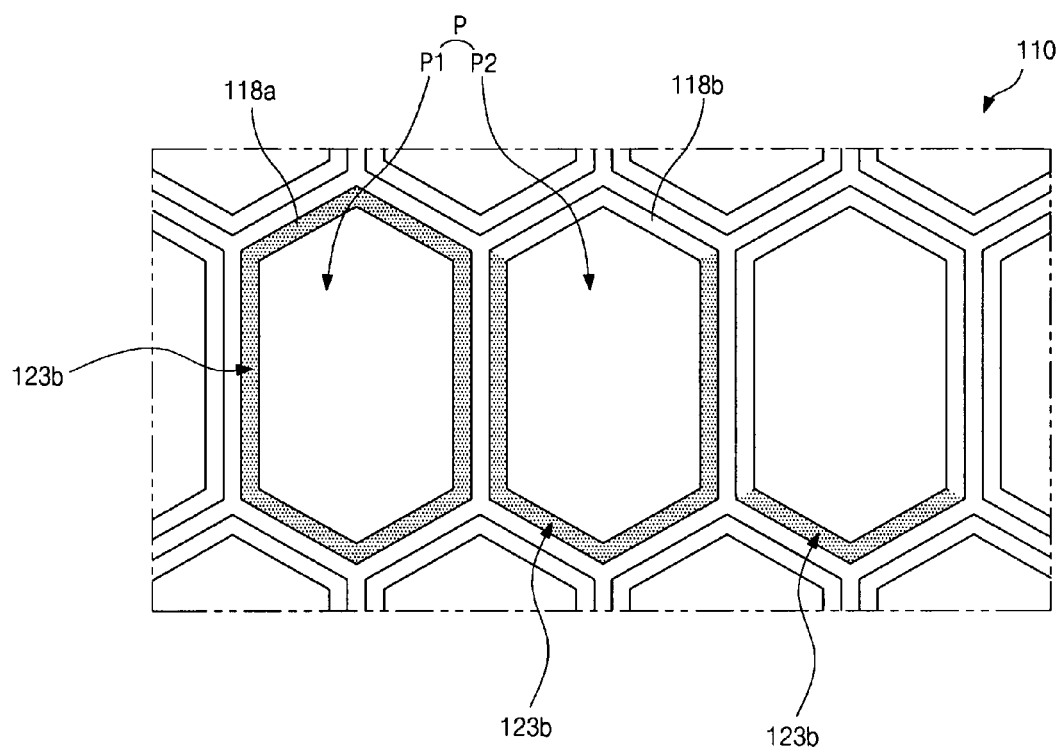

FIGS. 3A to 3E are plan view of a portion of a dual panel type OELD device according to present invention, respectively. Each of FIGS. 3A to 3E is focused on a wall and a second pattern served as a spacer on an upper substrate of the dual panel type OELD device where an organic electroluminescent diode is formed. The second pattern is marked as a dot. FIGS. 3A and 3E respectively show the second patterns in adjacent pixel region have different shapes. However, they may have the same shape.

Referring to FIGS. 3A to 3E, first and second walls 118a and 118b spaced apart from each other are formed on an upper substrate 110. Each of the first and second walls 118a and 118b has a reverse-taper shape. The first wall 118a surrounds a first pixel region "P1", and the second wall 118b surrounds a second pixel region "P2". Namely, the first and second walls 118a and 118b respectively surround adjacent pixel regions "P". Each of the first and second walls 118a and 118b may have a rectangular shape as shown in FIGS. 3A to 3C or a honey comb shape as shown in FIGS. 3D and 3E. Each of the first and second walls 118a and 118b may have the same width in a portion surrounding the pixel regions "P", while a portion of each of the first and second walls 118a and 118b may have a greater width than other portions of each of the first and second walls 118a and 118b as shown in FIGS. 3B to 3D. In FIGS. 3B to 3D, each of the first and second walls 118a and 118b is branched into a region, where a first connection electrode will be formed, to form a protruding portion 190.

In FIGS. 3B to 3D, since the first connection electrode is formed in the region where the protruding portion 190 is formed, the upper substrate 110 and a lower substrate (not shown) has a point contact. Meanwhile, in FIGS. 3A and 3E, since a second pattern 123b having a line shape is used for connecting the upper substrate 110 and the lower substrate, the upper substrate 110 and a lower substrate has a line contact. Accordingly, the protruding portion is not required in FIGS. 3A and 3E.

Figure 4:
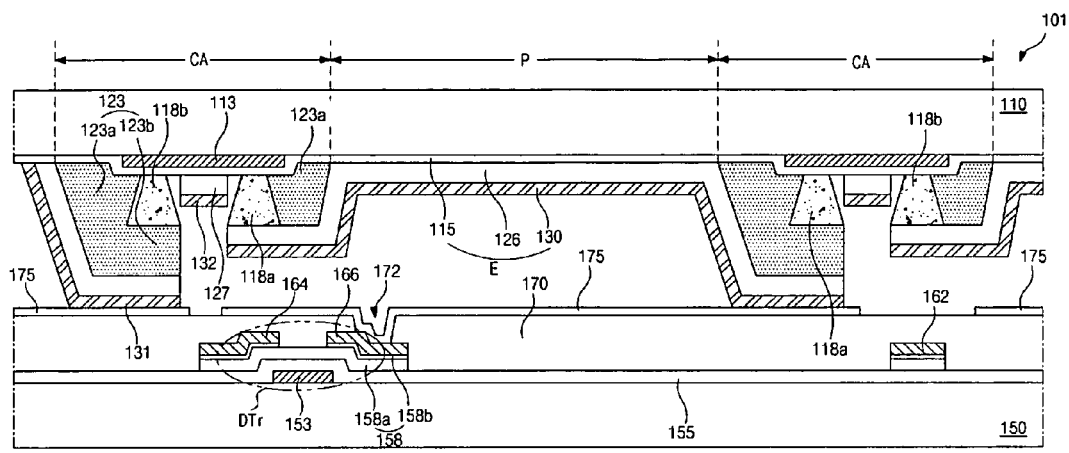
FIG. 4 is a cross-section view showing a pixel region of a dual panel type OELD device according to present invention.

Referring to FIG. 4, which is a cross-section view showing a pixel region of a dual panel type OELD device according to the present invention, a wall pattern 123 including first and second patterns 123a and 123b is formed on the first and second walls 118a and 118b. The first pattern 123a as a buffer pattern covers an outer surface of the first and second walls 118a and 118b. The second pattern 123b as a spacer covers an upper surface of at least one of the first and second walls 118a and 118b.

Referring again to FIGS. 3A to 3E, the second pattern 123b has various shapes. For example, one pixel region "P" may completely be surrounded by the second pattern 123b. Alternatively, sides except at least one side of the rectangular or hexagonal shape pixel region P may be surrounded by the second pattern 123b. When the first and second walls 118a and 118b includes the protruding portion 190, the second pattern 123b may be formed on the protruding portion 190 except other portions. In this case, the second pattern 123b has a column (pillar) or bar shape. Since the second pattern 123b on the first and second walls 118a and 118b has various shape, a connection area of a first connection electrode (not shown) on the second pattern 123b and a second connection electrode connected to a driving TFT (not shown) on the lower substrate can be controlled. For example, as shown in FIG. 3D, when the pixel region P has a honey comb shape, the protruding portion 190 may dispose a diamond shaped region positioned among adjacent four pixel regions P.

Although not shown, a first electrode of a transparent conductive material is formed on the upper substrate 110. An organic emitting layer emitting red, green and blue colors is formed on the first electrode. The organic emitting layer is positioned in a region surrounded by the first pattern 123a (of FIG. 4) such that the organic emitting layer in one pixel region "P" is isolated from another organic emitting layer in adjacent pixel region "P". In addition, a second electrode is formed on the organic emitting layer. The organic emitting layer and the second electrode in one pixel region "P" are naturally isolated from the organic emitting layer and the second electrode in adjacent pixel region "P" due to the first and second walls 118a and 118b and the first and second patterns 123a and 123b. The first electrode, the organic emitting layer and the second electrode constitute an organic electroluminescent diode. A portion of the second electrode on the second pattern 123b serves as the first connection electrode. In addition, an auxiliary electrode of a low resistance material may further formed under the first electrode to improve a conductivity of the first electrode. The auxiliary electrode is positioned at boundaries of the pixel region "P".

A plurality of gate lines and a plurality of data lines are formed on the lower substrate facing the upper substrate 110.

The gate and data lines cross each other to form the pixel region "P". A power supply line is formed on the lower substrate to be parallel to the data line. A switching TFT is formed at a crossing portion of the gate and data lines, and a driving TFT is connected to the switching TFT.

When the upper substrate 110 and the lower substrate are attached, the first connection electrode on the upper substrate contacts the second connection electrode connected to the driving TFT on the lower substrate such that the organic electroluminescent diode on the upper substrate is electrically connected to the driving TFT on the lower substrate. The upper substrate 110 and the lower substrate are sealed by a sealant along edges of at least one of the upper substrate 110 and the lower substrate to obtain the dual panel type OELD device according to the present invention. In the present invention, the organic electroluminescent diode and the driving TFT have a point contact or a line contact depending on a shape of the second pattern 123b.

Referring again to FIG. 4, a cross-sectional structure of the dual panel type OELD device is explained. In FIG. 4, the dual panel type OELD device 101 includes the upper substrate 110 and the lower substrate 150. The auxiliary electrode 113 of a low resistance material is formed on the transparent upper substrate 110 at boundaries of a pixel region "P". The first electrode 115 of a transparent conductive material having a relatively high work function is formed on an entire surface of the upper substrate 110 to cover the auxiliary electrode 113.

The first and second walls 118a and 118b are formed on the first electrode 115 at boundaries of the pixel region "P". In FIG. 4, the first and second walls 118a and 118b are positioned at ends of the auxiliary electrode 113. Each of the first and second walls 118a and 118b has a reverse-taper shape with respect to an inner surface of the upper substrate 110. Namely, one end, which is closer to the upper substrate 110 than the other end, of each of the first and second walls 118a and 118b has a first cross-sectional area smaller than a second cross-sectional area of the other end. The first and second walls 118a and 118b are spaced apart from each other by a pre-determined distance.

The wall pattern 123 including the first and second patterns 123a and 123b is formed on the first electrode 115 to partially cover the first and second walls 118a and 118b. The first pattern 123a covers a first side surface of the first wall 118a and a first side surface of the second wall 118b. A second side surface of the first wall 118a and a second side surface of the second wall 118b may not be covered with the wall patterns 123. The second side surface of the first wall 118a faces the second side surface of the second wall 118b, and the first side surfaces of the first and second walls 118a and 118b are respectively opposite to the second side surfaces of the first and second walls 118a and 118b. The second pattern 123b covers an upper surface of at least one of the first and second walls 118a and 118b. The second pattern 123b extends from the first pattern 123a. The second side surfaces of the first and second walls 118a and 118b have the reverse-taper shape, while a surface along the first side surfaces of the first and second walls 118a and 118b entirely has a taper shape. The second pattern 123b with at least one of the first and second walls 118a and 118b, where the second pattern 123b is formed, serves as a spacer. As explained above, the second pattern 123b may covers an entire surface of at least one of the first and second walls 118a and 118b or a partial surface of at least one of the first and second walls 118a and 118b. In addition, since the second pattern 123b has various shape, an area of the second pattern 123b is controllable such that a contact area of the first connection electrode 131 on the upper substrate 110 and the second connection electrode 175 on the lower substrate 150 is also controllable.

The organic emitting layer 126 is formed on the first electrode 115 the wall pattern 123. The organic emitting layer 126 in one pixel region "P" is isolated from the organic emitting layer 126 in adjacent pixel region "P" due to the first and second walls 118a and 118b and the wall pattern 123. For example, the organic emitting layers 126 in three adjacent pixel regions "P" respectively emit red, green and blue colors. FIG. 4 shows the organic emitting layer 126 of a single layer. However, to improve an emitting efficiency, the organic emitting layer 126 may include a multiple layer of an electron injection layer, an electron transporting layer, an organic emitting material layer, a hole transporting layer and a hole injection layer.

The second electrode 130 is formed on the organic emitting layer 126. The second electrode 130 in one pixel region "P" is also isolated from the second electrode 130 in adjacent pixel region "P" due to the first and second walls 118a and 118b and the wall pattern 123. The second electrode 130 may be formed of a metallic material having a relatively high work function, for example, aluminum (Al) or Al alloy. The first electrode 115, the organic emitting layer 126 and the second electrode 130 constitute the organic electroluminescent diode "E". The second electrode 130 is stacked over the first and second walls 118a and 118b and the first and second patterns 123a and 123b. A portion of the second electrode 130 is stacked over the second pattern 123b servers as a first connection electrode 131. The first connection electrode 131 contacts the second connection electrode 175 on the lower substrate 150 such that the second electrode 130 of the organic electroluminescent diode "E" is electrically connected to the driving TFT "DTr". During a step of forming the organic emitting layer 126 and the second electrode 130, there are an organic pattern 127 and a metal pattern 132 between the first and second walls 118a and 118b.

On the lower substrate 150, the gate lines (not shown) and the data lines 162 are formed with a gate insulating layer 155 interposed therebetween. The gate line and the data line 162 cross each other such that the pixel region "P" is defined. The switching TFT (not shown) connected to the gate line and the data line 162 is formed at a crossing portion of the gate line and the data line 162. At least one driving TFT "DTr" is electrically connected to the switching TFT. FIG. 4 shows a single driving TFT "DTr". Each of the switching TFT and the driving TFT "DTr" includes a gate electrode 153, a semiconductor layer 158 including an active layer 158a and an ohmic contact layer 158b, a source electrode 164 and a drain electrode 166, which are sequentially stacked. It may be called as a bottom gate structure. Alternatively, each of the switching TFT and the driving TFT "DTr" may have a top gate structure.

A passivation layer 170 including a contact hole 172 is formed on the switching TFT and the driving TFT "DTr". The contact hole 172 exposes an electrode, for example, the drain electrode 166, of the driving TFT "DTr". The passivation layer 170 is formed of an organic insulating material to form a flat top surface. Alternatively, the passivation layer 170 may be formed of an inorganic insulating material to form an uneven top surface depending on below structure.

The second connection electrode 175 connected to the drain electrode 166 of the driving TFT "DTr" is formed on the passivation layer 170. The upper and lower substrates 110 and 150 are attached such that the first connection electrode 131 on the upper substrate 110 contacts the second connection electrode 175 on the lower substrate 150. Although not shown, a seal pattern is formed along edges of at least one of the upper and lower substrates 110 and 150 to seal the upper and lower substrates 110 and 150. An inner space between the upper and lower substrates 110 and 150 has a vacuum condition or an inert gas condition. In addition, a getter pattern for absorbing moisture may be further formed.

Referring to FIGS. 5A to 5F, a fabricating process of a dual panel type OELD device according to the present invention is explained. FIGS. 5A to 5F are cross-sectional view illustrating a fabricating process of a dual panel type OELD device according to present invention. A region, where the wall is formed, is defined as a border region "CA".

Figure 5A:
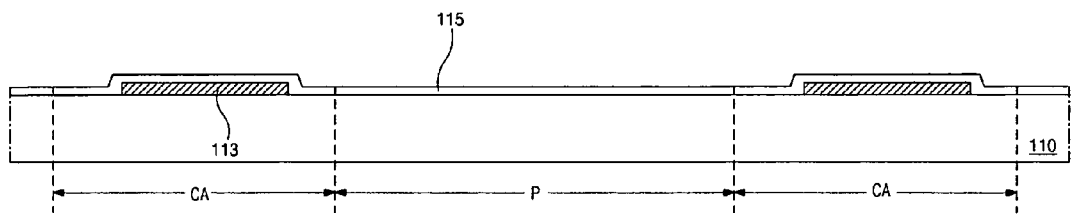
FIGS. 5A to 5F are cross-sectional view illustrating a fabricating process of a dual panel type OELD device according to present invention.

In FIG. 5A, the auxiliary electrode 113 is formed on the upper substrate 110 in the border region "CA" by depositing and pattering a first metal layer (not shown) through a mask process. The first metal layer may include a low resistance metallic material, such as Al, Al alloy, copper (Cu), Cu alloy and chromium (Cr). The mask process may include a step of forming a photoresist (PR) layer, a step of exposing the PR layer using a mask, a step of developing the exposed PR layer to form a PR pattern and a step of etching the first metal layer using the PR pattern as an etching mask. The auxiliary electrode 113 may have a lattice shape along boundaries of the pixel region "P" or a linear shape along a side of the pixel region "P".

The first electrode 115 of a transparent conductive material having a relatively high work function, such as indium-tin-oxide (ITO) and indium-zinc-oxide (IZO), is formed on an entire surface of the upper substrate 110 to cover the auxiliary electrode 113. The auxiliary electrode 113 is formed to improve a conductivity of the first electrode 115. The auxiliary electrode 113 may be omitted.

Figure 5B:
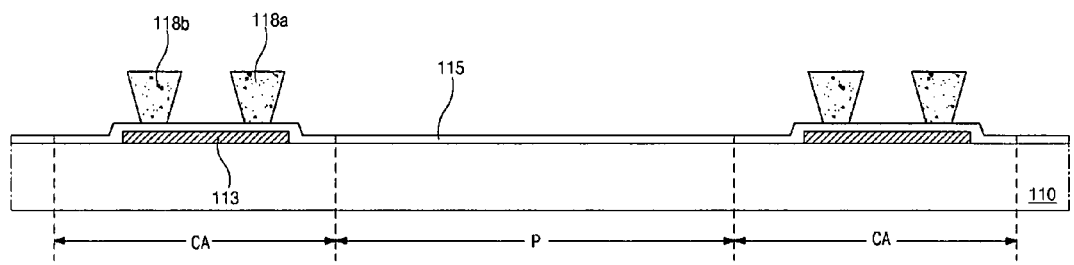

In FIG. 5B, the first and second walls 118a and 118b are formed on the first electrode 115 in the border region "CA" by coating and pattering an organic insulating material layer (not shown). Each of the first and second walls 118a and 118b has a reverse-taper shape. The organic insulating material has a negative photosensitive property such that the organic insulating material layer having the reverse-taper shape can be obtained. A portion of the organic insulating material layer having a negative photosensitive property is chemically changed when being exposed to light such that the exposed portion remains after a developing process. When the organic insulating material layer is exposed to light, amount of light to a top surface of the organic insulating material layer is different from amount of light to a bottom surface of the organic insulating material layer. The exposed organic insulating material layer is developed such that the reverse-taper shape can be obtained.

Figure 5C:
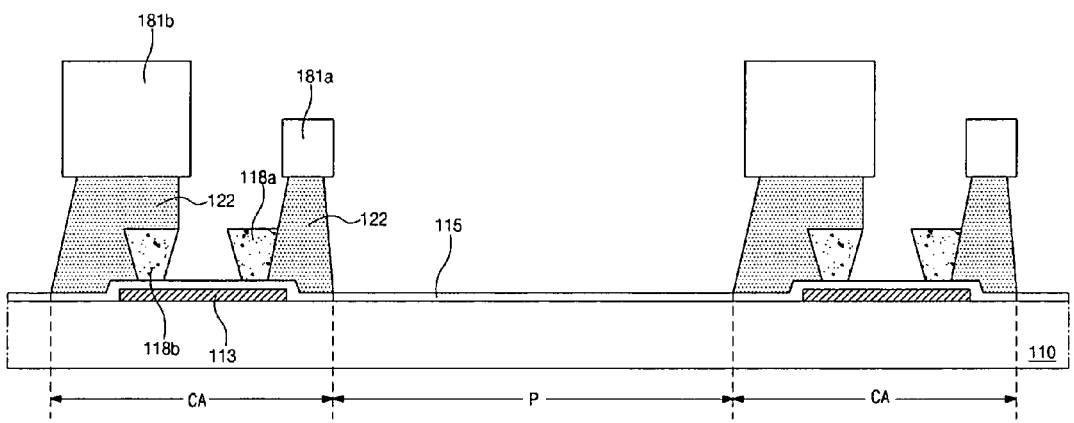

In FIG. 5C, a polymer material layer (not shown) is formed on an entire surface of the upper substrate 110, where the first and second walls 118a and 118b are formed, by coating a polymer material, for example, polyimide. A PR layer (not shown) is further formed on the polymer material layer, and then the PR layer is exposed and developed using a diffractive exposing method or a half-tone exposing method to form a first PR pattern 181a having a first thickness and a second PR pattern 181b having a second thickness greater than the first thickness. In the diffractive exposing method or the half-tone exposing method, an exposing mask including a transmissive portion, a half-transmissive portion and a blocking portion. The half-transmissive portion has a transmissivity smaller than transmissive portion and larger than the blocking portion. The first PR pattern 181a is formed a first region where the first pattern 123a will be formed, and the second PR pattern 181b is formed a second region where the second pattern 123b will be formed.

Next, a portion of the polymer material layer exposed through the first and second PR patterns 181a and 181b is etched to form a polymer pattern 122 covering the first side surfaces of the first and second walls 118a and 118b and the upper surface of at least one of the first and second walls 118a and 118b. The polymer pattern 122 corresponding to the first wall 118a has the same height from the first electrode 115 as the polymer pattern 122 corresponding to the second wall 118b.

Figure 5D:
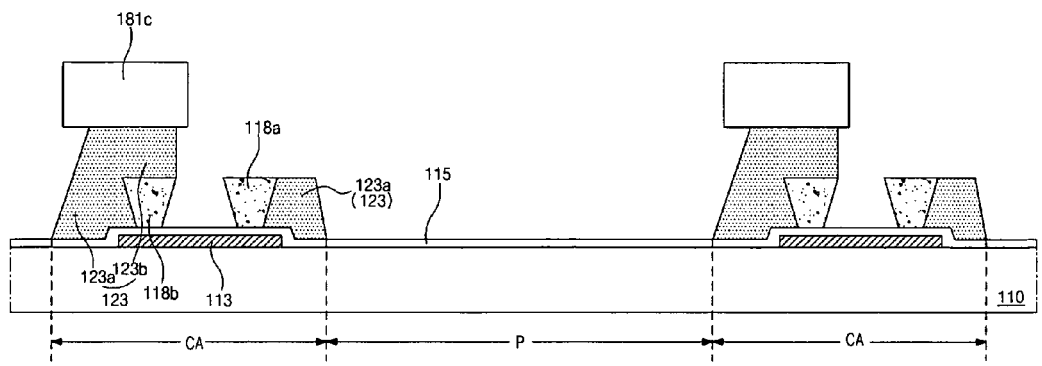

Next, in FIG. 5D, the first and second PR patterns 181a and 181b (of FIG. 5C) are ashed to remove the first PR pattern 181a and form a third PR pattern 181c from the second PR pattern 181b. The exposed polymer pattern 122 by removing the first PR pattern 181a is dry-etched to have the same height as the first wall 118a. The polymer pattern 122 corresponding to the second wall 118b is covered with the third PR pattern 181c such that the polymer pattern 122 corresponding to the first wall 118a has a different in height from the first electrode 115 as the polymer pattern 122 corresponding to the second wall 118b. The polymer pattern 122 corresponding to the first wall 118a covers the first side surface of the first wall 118a, not the upper surface of the first wall 118a. The polymer pattern 122 corresponding to the first wall 118a is defined as the first pattern 123a of the wall pattern 123.

The polymer pattern 122 corresponding to the second wall 118b covers not only the first side surface of the second wall 118b but also the upper surface of the second wall 118b. A portion of the polymer pattern 122 covering the first side surface of the second wall 118b is defined as the first pattern 123a, and a portion of the polymer pattern 122 covering the upper surface of the second wall 118b is defined as the second pattern 123b of the wall pattern 123. As a result, the second pattern 123b has a greater height from the first electrode 115 than the first pattern 123a. The first pattern 123a serves as a buffer pattern in the related art dual panel type OELD device, and the second pattern 123b serves as a spacer.

Figure 5E:
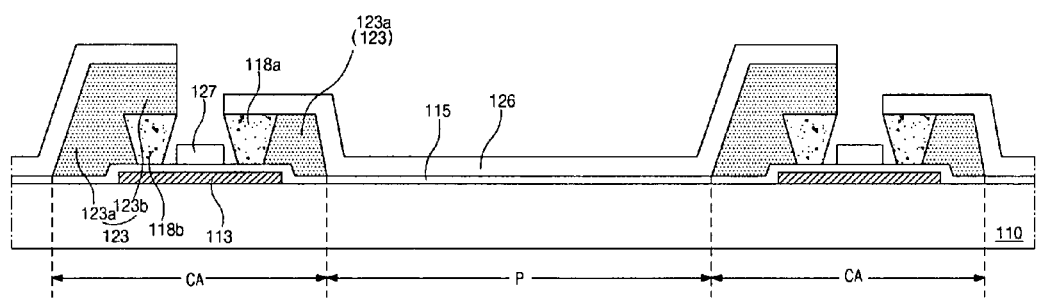

Next, in FIG. 5E, the third PR pattern 181c (of FIG. 5D) on the second pattern 123b is removed by a stripping process, and then the organic emitting layer 126 is formed on the first and second patterns 123a and 123b and the first electrode 115 in the pixel region "P" by depositing an organic emitting material or coating an organic emitting material by a nozzle coating apparatus or an inkjet apparatus. The organic emitting layer 126 emits red, green and blue colors. The organic emitting layer 126 also covers an upper surface of the second pattern 123b. At the same time, an organic pattern 127 is formed in a space between the first and second patterns 123a and 123b.

Figure 5F:
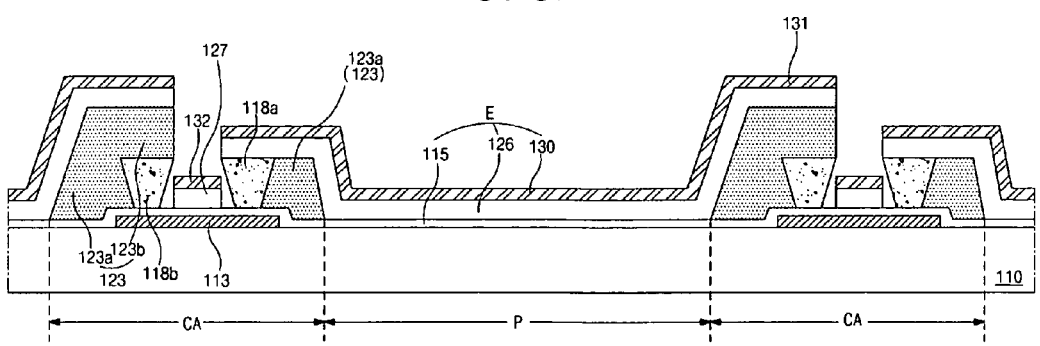

Next, in FIG. 5F, the second electrode 130 is formed on the organic emitting layer 126 by depositing a metallic material having a relatively low work function, for example, Al or Al alloy. The metallic material of the second electrode 130 has a work function smaller than the transparent conductive material of the first electrode 115. At the same time, a metal pattern 132 is formed on the organic pattern 127. Namely, the organic pattern 127 and the metal pattern 132 are positioned in the border region "CA". The organic patter 127 and the metal pattern 132 are respectively discontinuous from the organic emitting layer 126 and the second electrode 130 because of the first and second walls 118a and 118b. The organic emitting layer 126 and the second electrode 130 in one pixel region "P" are naturally isolated from those in adjacent pixel region "P" due to the first and second walls 118a and 118b. A portion of the second electrode 130 covering the organic emitting layer on the second pattern 123b serves as the first connection electrode 131. The first electrode 115, the organic emitting layer 126 and the second electrode 130 constitute the organic electroluminescent diode "E".

Referring back to FIG. 4, the upper substrate 110 and the lower substrate 150, where the switching TFT, the driving TFT "DTr" and the second connection electrode 175 are formed, face so that the first connection electrode 131 on the second pattern 123b contacts the second connection electrode 175 connected to the driving TFT "DTr". And then, a seal pattern (not shown) is formed along edges of the upper and lower substrates 110 and 150, and the upper and lower substrates 110 and 150 are attached with a vacuum condition or an inert gas condition therein such that the dual panel type OELD device 101 is obtained.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A dual panel type organic electroluminescent display device, comprising:
    a first and a second substrates facing each other and having a pixel region and a border region at a boundary of the pixel region;
    a first electrode in the pixel region and the border region and on the first substrate;
    a first and a second walls in the border region and on the first electrode, the first and the second walls spaced apart from each other, each of the first and the second walls having a reverse-taper shape with respect to the first substrate and a first and a second side surfaces, wherein the second side surface of the first wall faces the second side surface of the second wall, and the first side surfaces of the first and the second walls are respectively opposite to the second side surfaces of the first and the second walls;
    a first pattern covering the first side surfaces of the first and the second walls and having a first height from the first electrode;
    a second pattern covering an upper surface of one of the first and the second walls and having a second height from the first electrode greater than the first height;
    an organic emitting layer on the first electrode, the second pattern and the first pattern on the other one of the first and the second walls;
    a second electrode on the organic emitting layer, a portion of the second electrode covering an upper surface of the organic emitting layer on the second pattern;
    a switching thin film transistor in the pixel region and on the second substrate;
    a driving thin film transistor in the pixel region and on the second substrate, the driving thin film transistor connected to the switching thin film transistor; and
    a connection electrode on the second substrate and connected to the driving TFT and the portion of the second electrode,
    wherein a first portion of the second electrode corresponding to the first wall and a second portion of the second electrode corresponding to the second wall have a difference in a distance from the second substrate, and the organic emitting layer contacts an upper surface of the other one of the first and the second walls.

2. The device according to claim 1, wherein each of the first and second patterns is formed of a polyimide.

3. The device according to claim 1, wherein the second pattern partially covers the upper surface of the one of the first and the second walls.

4. The device according to claim 1, wherein the second pattern entirely covers the upper surface of the one of the first and the second walls.

5. The device according to claim 1, wherein each of the first and the second walls includes a protruding portion protruding from each of the first and second the walls to an inner or outer side of the pixel region, and the second pattern covering an upper surface of the protruding portion.

6. The device according to claim 5, wherein the pixel region has a honey comb shape, and the protruding portion is disposed in a diamond shaped region positioned among adjacent four pixel regions, and wherein a portion of the second electrode is disposed on the protruding portion and the connection electrode contacts the portion of the second electrode on the protruding portion.

7. The device according to claim 1, further comprising an auxiliary electrode of a low resistance metallic material in the border region and between the first substrate and the first electrode.

8. A dual panel type organic electroluminescent display device, comprising:
    a first and a second substrates facing each other and having a pixel region and a border region at a boundary of the pixel region;
    a first electrode in the pixel region and the border region and on the first substrate;
    a first and a second walls in the border region and on the first electrode, the first and the second walls spaced apart from each other, each of the first and the second walls having a reverse-taper shape with respect to the first substrate and a first and a second side surfaces, wherein the second side surface of the first wall faces the second side surface of the second wall, and the first side surfaces of the first and second walls are respectively opposite to the second side surfaces of the first and second walls;
    a protruding portion extending from at least one of the first wall and the second wall into the pixel region;
    a first pattern covering the first side surfaces of the first and the second walls and having a first height from the first electrode;
    a second pattern covering an upper surface of the protruding portion and having a second height from the first electrode greater than the first height;
    an organic emitting layer on the first electrode and the protruding portion;
    a second electrode on the organic emitting layer, a portion of the second electrode covering an upper surface of the organic emitting layer on the protruding portion;
    a switching thin film transistor in the pixel region and on the second substrate;
    a driving thin film transistor in the pixel region and on the second substrate, the driving thin film transistor connected to the switching thin film transistor; and
    a connection electrode on the second substrate and connected to the driving TFT and the portion of the second electrode.

9. A method of fabricating a dual panel type organic electroluminescent display device, comprising:
    forming a first electrode on an entire surface of a first substrate having a pixel region and a border region at a boundary of the pixel region;
    forming a first and a second walls of an insulating material in the border region and on the first electrode, the first and the second walls spaced apart from each other, each of the first and the second walls having a reverse-taper shape with respect to the first substrate and a first and a second side surfaces, wherein the second side surface of the first wall faces the second side surface of the second wall, and the first side surfaces of the first and the second walls are respectively opposite to the second side surfaces of the first and the second walls;

forming a polymer material layer on the first and the second walls and having a flat top surface;

forming a first and a second photoresist patterns on the polymer material layer and corresponding to the first and the second walls, a thickness of the first photoresist pattern being smaller than a thickness of the second photoresist pattern;

removing a first portion of the polymer material layer exposed through the first and second the photoresist patterns to form a polymer pattern covering the first side surfaces of the first and the second walls and an upper surface of each of the first and the second walls;

exposing a portion of the upper surface of each of the first and the second walls by completely removing the first photoresist pattern and forming a third photoresist patterning by partially removing the second photoresist pattern;

removing a second portion of the polymer pattern exposed through the third photoresist pattern to form a first pattern covering the first side surfaces of the first and the second walls and having a first height from the first electrode and a second pattern covering an upper surface of one of the first and the second walls and having a second height from the first electrode greater than the first height;

forming an organic emitting layer on the first electrode, the first and the second patterns; and forming a second electrode on the organic emitting layer, a portion of the second electrode covering an upper surface of the organic emitting layer on the second pattern, wherein a first portion of the second electrode corresponding to the first wall and a second portion of the second electrode corresponding to the second wall have a difference in a distance from the second substrate, and the organic emitting layer contacts an upper surface of the other one of the first and the second walls.

10. The method according to claim 9, wherein the step of forming the first and second walls includes forming a protruding portion protruding from each of the first and second walls to an inner or outer side of the pixel region.

11. The method according to claim 10, wherein the pixel region has a honey comb shape, and the protruding portion is disposed in a diamond shaped region positioned among adjacent four pixel regions, and wherein a portion of the second electrode is disposed on the protruding portion.

12. The method according to claim 11, wherein the second pattern covering an upper surface of the protruding portion.

13. The method according to claim 9, wherein the second pattern partially covers the upper surface of the one of the first and the second walls.

14. The method according to claim 9, wherein the second pattern entirely covers the upper surface of the one of the first and the second walls.

15. The method according to claim 9, further comprising forming an auxiliary electrode of a low resistance metallic material in the border region on the first substrate before the step of forming the first electrode.

16. The method according to claim 9, further comprising:
forming a gate and a data lines on a second substrate and crossing each other to define the pixel region;
forming a switching thin film transistor connected to the gate and the data lines and on the second substrate;
forming a driving thin film transistor connected to the switching thin film transistor and on the second substrate;
forming a connection electrode on the second substrate and connected to the driving thin film transistor; and
attaching the first and second substrates so that the connection electrode contacts a portion of the second electrode corresponding to the second pattern.

17. A method of fabricating a dual panel type organic electroluminescent display device, comprising:
forming a first electrode on an entire surface of a first substrate having a pixel region and a border region at a boundary of the pixel region;
forming a first and a second walls of an insulating material in the border region and on the first electrode and a protruding portion of the insulating material extending from the first wall into the pixel region, the first and the second walls spaced apart from each other, each of the first and the second walls having a reverse-taper shape with respect to the first substrate and the first and the second side surfaces, wherein the second side surface of the first wall faces the second side surface of the second wall, and the first side surfaces of the first and second walls are respectively opposite to the second side surfaces of the first and the second walls;
forming a first pattern covering the first side surfaces of the first and the second walls and having a first height from the first electrode and a second pattern covering an upper surface of the protruding portion and having a second height from the first electrode greater than the first height;
forming an organic emitting layer on the first electrode and the protruding portion;
forming a second electrode on the organic emitting layer, a portion of the second electrode covering an upper surface of the organic emitting layer on the protruding portion;
forming a switching thin film transistor in the pixel region and on the second substrate;
forming a driving thin film transistor in the pixel region and on the second substrate, the driving thin film transistor connected to the switching thin film transistor;
forming a connection electrode on the second substrate and connected to the driving TFT; and
attaching the first and the second substrates so that the connection electrode contacts a portion of the second electrode corresponding to the second pattern.

* * * * *